US005380211A

United States Patent [19]

Kawaguchi et al.

[11] Patent Number: 5,380,211

[45] Date of Patent: Jan. 10, 1995

[54] COAXIAL CONNECTOR FOR CONNECTING TWO CIRCUIT BOARDS

[75] Inventors: Akira Kawaguchi, Musashimurayama; Akihiko Ohtsu, Kawasaki, both of Japan

[73] Assignee: The Whitaker Corporation, Wilmington, Del.

[21] Appl. No.: 90,388

[22] Filed: Jul. 12, 1993

[30] Foreign Application Priority Data

Aug. 5, 1992 [JP] Japan .................................. 4-227825

[51] Int. Cl.[6] .......................... H01R 9/03; H05K 1/00

[52] U.S. Cl. ...................................... 439/74; 439/581; 439/700

[58] Field of Search ...................... 439/74, 75, 83, 66, 439/609, 637, 62, 63, 581, 700, 824, 842

[56] References Cited

U.S. PATENT DOCUMENTS

| | | | |
|---|---|---|---|
| 2,879,491 | 3/1959 | Shapiro | 439/62 |
| 3,760,329 | 9/1973 | Stepan . | |
| 4,089,576 | 5/1978 | Barchet | 439/507 |
| 4,506,939 | 3/1985 | Faulkenberry et al. | 439/63 |
| 4,511,196 | 4/1985 | Schuler et al. | 29/842 X |
| 4,603,926 | 8/1986 | Nesbit et al. | 439/581 X |
| 4,707,039 | 11/1987 | Whipple | 439/75 |
| 4,819,131 | 4/1989 | Watari | 439/65 X |
| 4,936,795 | 6/1990 | Kawai et al. | 439/609 |
| 5,065,280 | 11/1991 | Karnezos et al. | 439/74 X |
| 5,174,763 | 12/1992 | Wilson | 439/66 |
| 5,192,213 | 3/1993 | Kosugi et al. | 439/83 X |

FOREIGN PATENT DOCUMENTS

| | | | |
|---|---|---|---|
| 0417899 | 3/1991 | European Pat. Off. . | |
| 2917111 | 11/1980 | Germany | 439/63 |

*Primary Examiner*—Z. R. Bilinsky

*Attorney, Agent, or Firm*—Adrian J. LaRue

[57] ABSTRACT

A coaxial connector for connecting two substrates with reduced component count and suitable for high density packaging comprises a housing 26 having a throughhole 28 which is placed on a circuit board 2. A male terminal 22 is secured in the housing 26 and is connected to a ground conductor 18. On the other hand, a housing 66 having a throughhole 68 is placed on another circuit board 4. A female terminal 62 is secured in the housing 66 and is connected to a ground conductor 19. Signal conductors 16, 17 are formed on the circuit boards 2, 4, respectively. A bolt 6 is used to mate both housings 26, 66 to connect the circuit boards 2, 4 and electrically interconnect the signal conductors 16, 17 on the both circuit boards 2, 4.

11 Claims, 4 Drawing Sheets

COAXIAL CONNECTOR FOR CONNECTING TWO CIRCUIT BOARDS

FIELD OF THE INVENTION

The present invention relates generally to an electrical connector, more specifically to a coaxial connector for interconnecting two substantially parallel circuit boards.

BACKGROUND OF THE INVENTION

High frequency signal transmission is essential in such electronic appliances and equipment as communication equipment, computers, etc. In such electronic appliances and equipment, it is typical to use a plurality of substrates or circuit boards. In order to transmit wideband signals between such substrates with minimum signal distortion, it is typical to connect a coaxial connector on each substrate and interconnect such coaxial connectors with a proper length of coaxial cable or jumper cable. One typical example of such conventional coaxial connector is an L-type connector 100 in FIG. 6 as disclosed in Japanese Publication No. 110780/'91. The L-type connector 100 comprises a cap connector 106 mounted on a substrate 108 and a plug connector 104 connected to one end of a coaxial cable 102.

In the conventional coaxial connector as mentioned above, component count is relatively large, and a relatively large space for accommodating the jumper cable is needed. Also, the mating operation of the matable coaxial connectors is not easy and is time consuming. Additionally, such conventional coaxial connector is not suited for compact and high density electronic appliances having a limited space.

SUMMARY OF THE INVENTION

It is therefore an object of the present invention to provide a coaxial connector for connecting two substrates which requires less space, has small component count, and is simple in construction and mating operation.

In order to solve the problems associated with the conventional coaxial connector, the coaxial connector for connecting two substrates according to the present invention uses an electrically conductive screw as the center conductor of the coaxial connector as well as mounting the two substrates substantially parallel to each other.

BRIEF DESCRIPTION OF THE DRAWINGS

The invention will now be described by way of example with reference to the accompanying drawings in which.

DETAILED DESCRIPTION OF THE INVENTION

Preferred embodiments of the coaxial connector for connecting two substrates according to the present invention, hereinafter referred to simply as a coaxial connector will be described hereunder in detail by reference to accompanying drawings.

Figure 1:
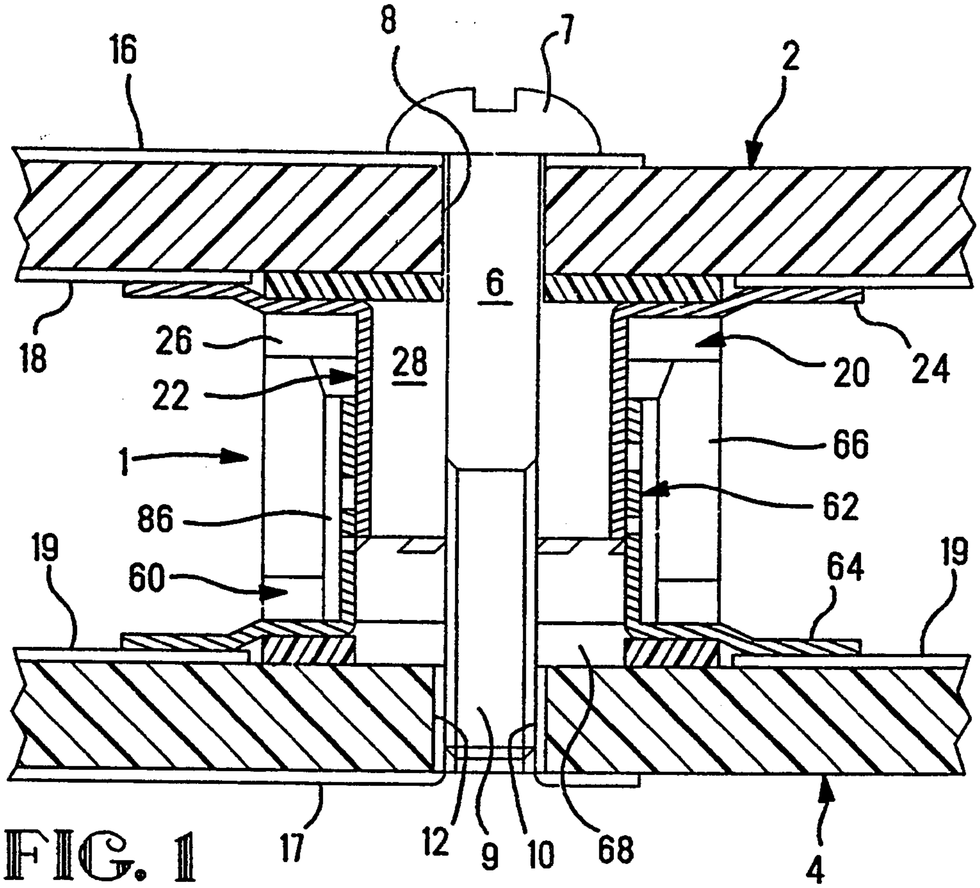
FIG. 1 is a vertical cross-sectional view of one preferred embodiment of the coaxial connector for connecting two substrates according to the present invention.
Figure 6:
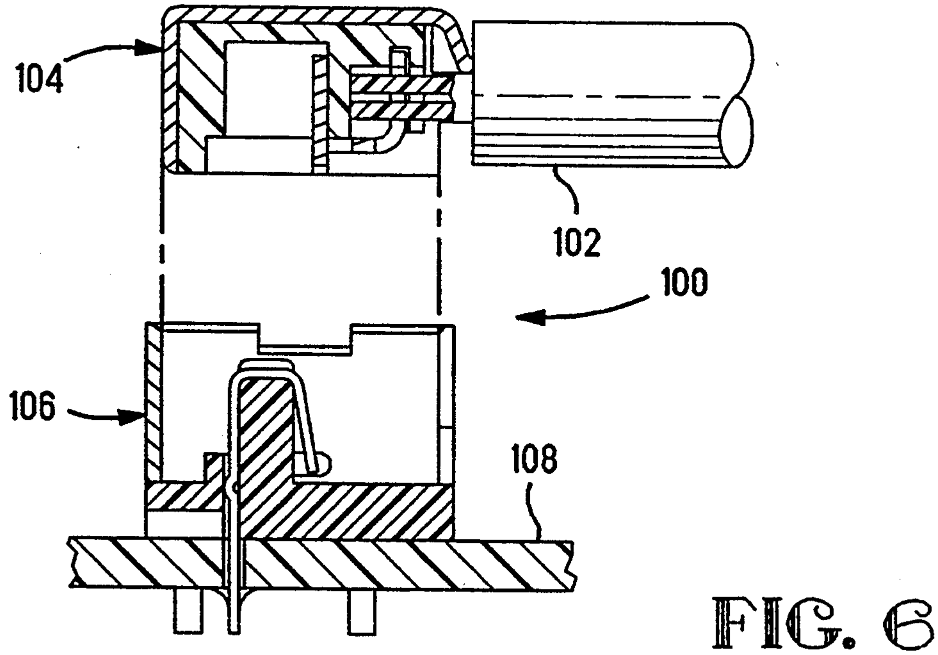
FIG. 6 Prior Art
FIG. 6 is a cross-sectional view of a conventional coaxial connector.

Illustrated in FIG. 1 is a longitudinal cross sectional view at one part of interconnection between a pair of substantially parallel circuit boards 2, 4 utilizing a coaxial connector 1 according to the present invention. The coaxial connector 1 comprises a male connector 20 and a female connector 60.

In FIG. 1, the male connector 20 has a male terminal 22 press fitted in a housing 26 with legs 24 of the male terminal 22 surface mounted on a ground conductor 18 on one circuit board 2. On the other hand, the female connector 60 has a female terminal 62 press fitted in a housing 66 with legs 64 of the female terminal 62 surface mounted on a ground conductor 19 on the other circuit board 4. Both connectors 20, 60 are mated with each other and a bolt 6 or an electrically conductive screw is inserted into a bolt-receiving hole 8 in the circuit board 2 at the center of the coaxial connector 1 so that the bolt 6 is screwed into a threaded hole 10 in the circuit board 4 for mounting both circuit boards 2, 4. Preferably, the female threaded section 10 is made by tapping thick plating in an opening 12 in the circuit board 4; however, it may be a separate threaded grommet. When completely mated, the bolt 6 makes electrical connection between signal conductors 16, 17 on the outer surfaces of the circuit boards 2, 4 while acting as a center conductor of the coaxial connector. That is, a head 7 of the bolt 6 makes electrical connection with the signal conductor 16 by pressing thereon, while a threaded section 9 of the bolt 6 contacts the threaded section 10 electrically connected to the signal conductor 17. Since the bolt 6 is a part of the signal path, it is required to be an electrically conductive such as, for example, copper. Also, it may be possible or preferable to use a spring washer between the head 7 of the bolt 6 and the signal conductor 16 to improve electrical contact therebetween.

Mating between the male connector 20 and the female connector 60 can be made by slightly inserting the male terminal 22 into the female terminal 62 and then rotating the bolt 6 so that the both connectors 20, 60 move toward to each other until they are completely mated. The bolt 6 may be made from brass, copper, etc. plated with nickel over the entire surface. It may therefore be made from a highly electrically conductive material as copper if plated with highly conductive material. It is of course true that the bolt 6 may be made of good electrically conductive metal without any plating. It can be any bolt complying with the JIS (Japanese Industrial Standards). A suitable size of the bolt 6 is, for example, in the range of M0.8 to M1.5. The bolt length may be about 5-mm or longer depending on the gap between the two circuit boards 2, 4.

Figure 4:
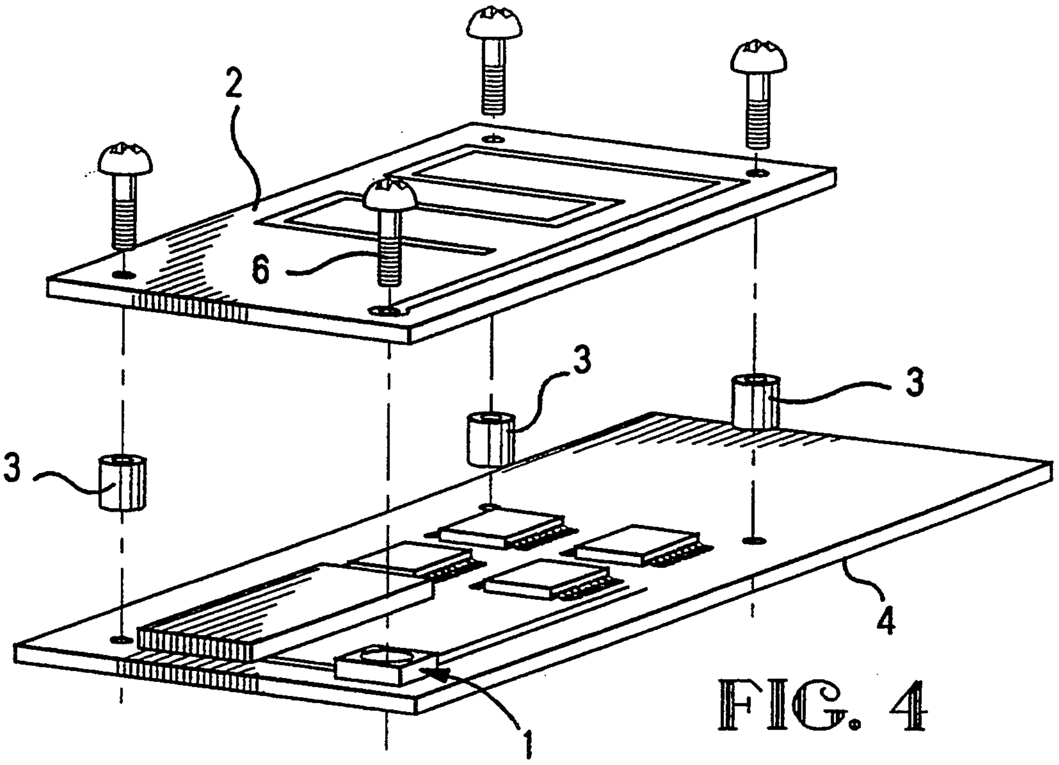
FIG. 4 is a perspective view showing an application of the coaxial connector for connecting two substrates according to the present invention.

The gap between the two circuit boards 2, 4 is usually maintained constant using a plurality of spacers 3 as shown in FIG. 4. The spacers 3 are usually mounted by screws. In the particular coaxial connector 1 as shown in FIG. 4, the coaxial connector 1 of the present invention may replace the spacers 3, thereby reducing the number of spacers 3 and also simplifying the mounting assembly of the circuit boards 2, 4.

Figure 2A:
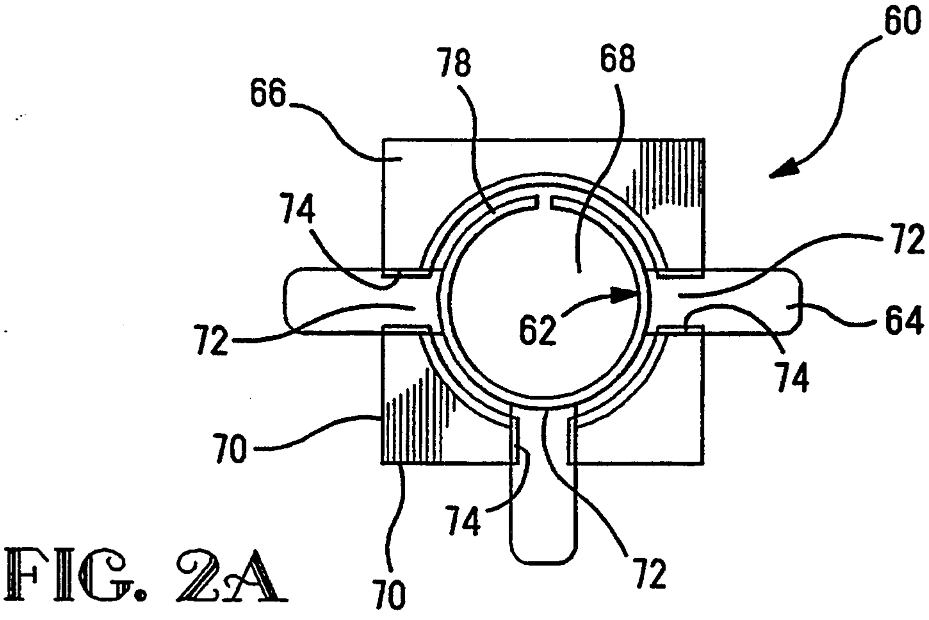
FIGS. 2A–C are respective plan, front and vertical cross-sectional views showing the female connector constituting one half of the coaxial connector for connecting two substrates according to the present invention.
Figure 2B:
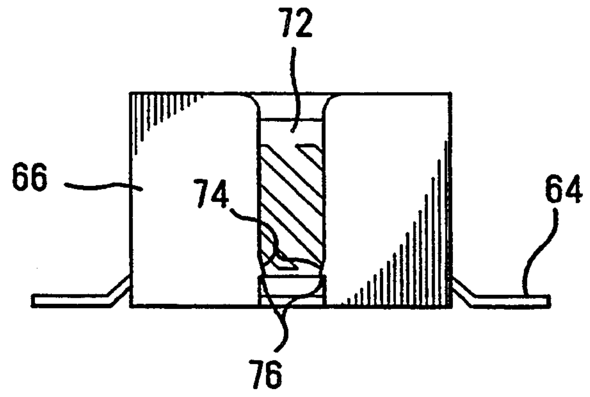
Figure 2C:
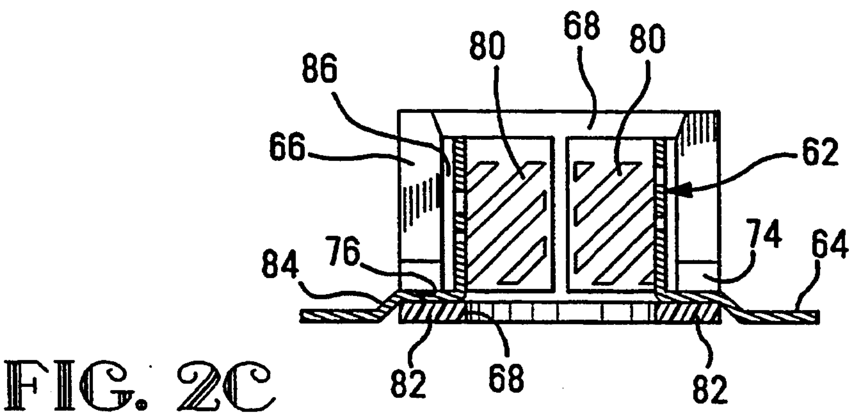

Illustrated in FIGS. 2A–C is the female connector 60. The housing 66 is generally rectangular as best shown in FIG. 2A and has a throughhole 68 at the center thereof to position the female terminal 62 therein. The housing 66 is formed with slots 72 at three locations for receiving legs 64 of the female terminal 62. Each slot 72 is in communication with the hole 68. As best shown in FIG. 2B, there are formed opposed projections 74 on the inner surfaces of each slot 72. Each projection 74 is tapered at the top and has step portions 76 parallel with the circuit board 4 at the lower portion.

As shown in FIG. 2A and FIG. 2C, the female terminal 62 is made by stamping and forming a metal plate such as phosphor bronze or brass. Each female terminal 62 comprises a cylindrical mainbody section 72 and legs 64 extending horizontally in three directions from the bottom portion of the mainbody section 72 which is formed with a plurality of slots 80. It is preferable that the mainbody section 62 is formed with inward curves or recesses for providing resiliency when mated with the male terminal 22. The female terminal 62 is inserted into the hole 68 after aligning its legs 64 with the slots 72 in the housing 66. The inserted female terminal 62 is secured in the housing 66 by press fitting the legs 64 between the bottom 82 of the housing 66 and the step portions 76 of the projections 74. Now, the legs 64 are ready to be surface mounted on the surface of the ground conductor 19 of circuit board 4 via the sloped or tapered sections 84.

Figure 3A:
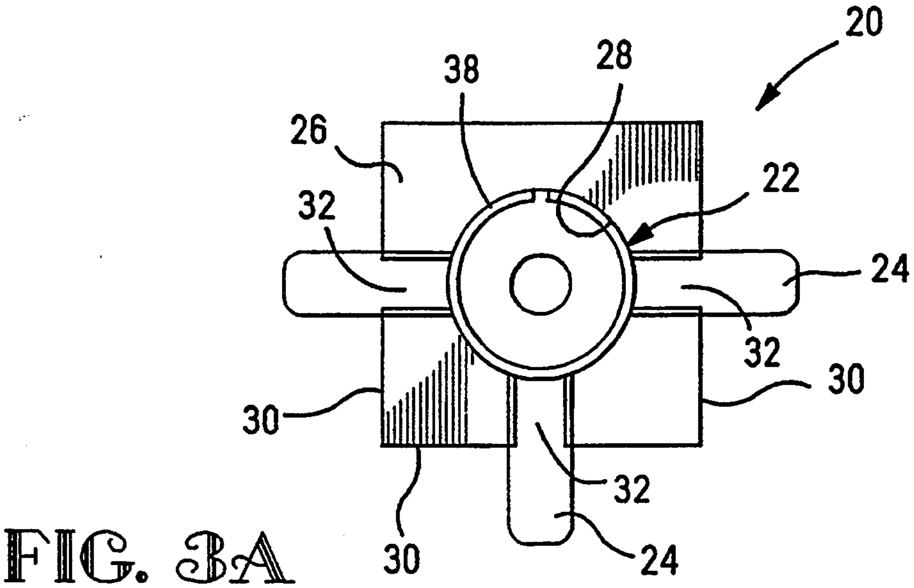
FIGS. 3A–C are respective plan, front and vertical cross-sectional views showing the male connector constituting the other half of the coaxial connector for connecting two substrates according to the present invention.
Figure 3B:
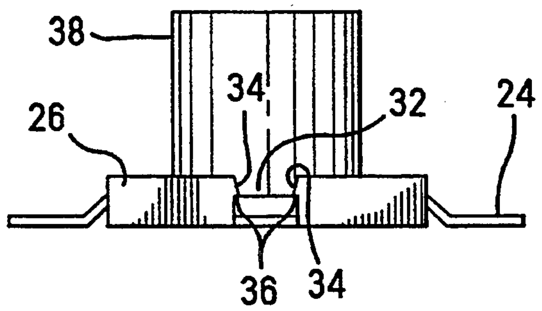
Figure 3C:
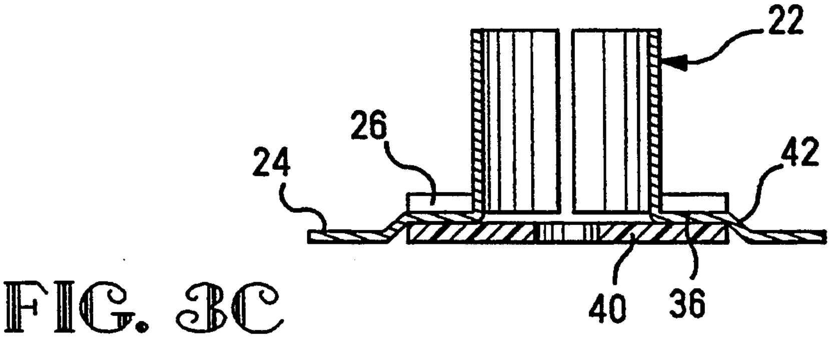

Now, reference is made to FIGS. 3A–C illustrating the male connector 20. As best shown in FIG. 3A, the housing 26 is a generally rectangular box shape having a hole 28 at the center to locate the male terminal 22. The housing 26 is formed with slots 32 in the sidewall 20 to receive the legs 24 of the male terminal 22 at three locations. Each slot 32 is in communication with the hole 28. As shown in FIG. 3B, there are formed spaced projections 34 on the inner surface of each slot 32. The projection 34 is tapered upwardly and has a step portion 36 at the lower portion in parallel with the circuit board 2.

As best shown in FIG. 3A and C, the male terminal 22 is made by stamping and forming a metal plate. The male terminal 22 comprises a cylindrical mainbody section 38 and legs 24 extending in three directions from the lower portion of the mainbody section 38 substantially parallel with circuit board 2. The mainbody section 38 is dimensioned to contact the inner surface of the female terminal 62. Similarly to the female terminal 62, the male terminal 22 is secured in the housing 26 by press fitting the legs 24 in the slots 32 and between the bottom portion 40 of the housing 26 and the step sections 36. The legs 24 are bent at the tapered portion 42 for surface mounting onto ground conductor 18 of circuit board 2.

Figure 5:
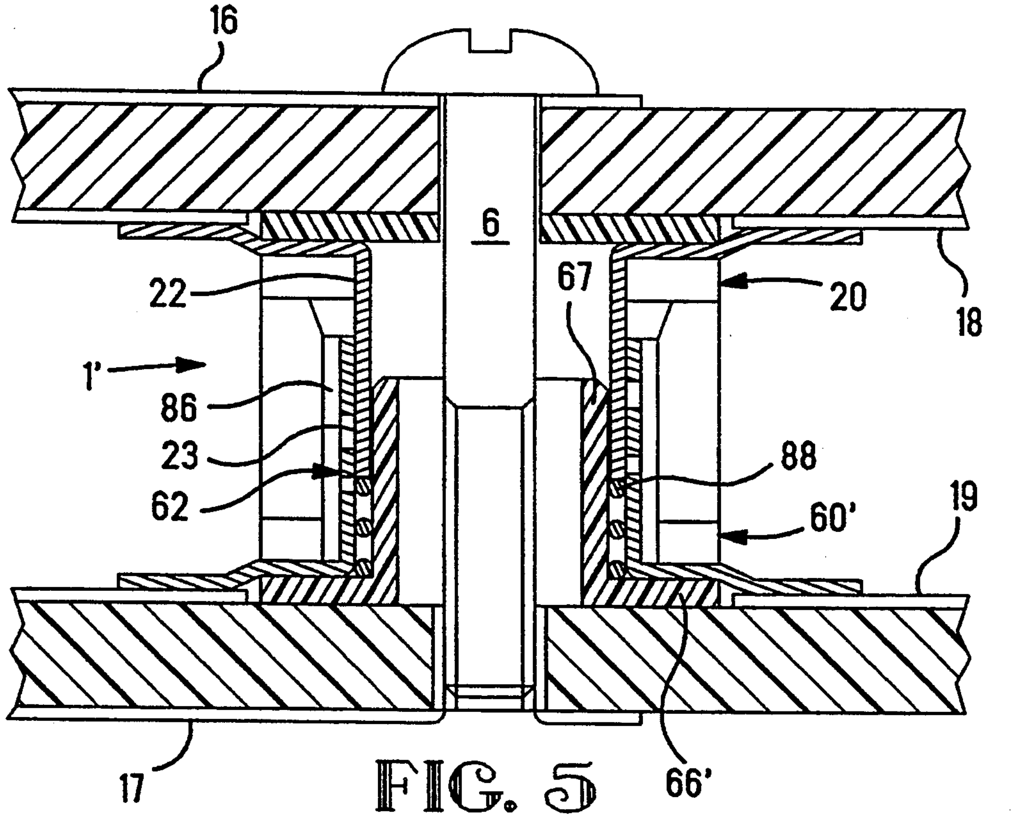
FIG. 5 is a vertical cross-sectional view similar to FIG. 1 showing another embodiment of the coaxial connector for connecting two substrates according to the present invention.

FIG. 5 is another embodiment of the coaxial connector 1 for connecting two substrates according to the present invention. For convenience, similar reference numerals are used in FIG. 5 to refer to like elements as in FIG. 1. This particular embodiment of the coaxial connector 1′ for connecting two substrates comprises a female connector 60′ including a housing 66′ having a cylindrical section 67 therein. There is provided an electrically conductive coil spring 88 between the cylindrical section 67 and the female terminal 62. When the male connector 20 and the female connector 60′ are mated with each other, the male terminal 22 is inserted in the gap between the cylindrical section 67 and the female terminal 62. The inserted male terminal 22 compresses the coil spring 88 at the front end 23 of the male terminal 22. The coil spring 88 protects loosening of the coaxial connector 1′. The coil spring 88 is dimensioned to contact the female terminal 62, thereby making positive electrical contact between the male terminal 22 and the female terminal 62.

Referring again to FIG. 1, a description will be made on the fully mated male connector 20 and female connector 60. In order to absorb any slight misalignment between the circuit boards 2, 4, there is formed a clearance or gap 86 between the female terminal 62 and the housing 66. The clearance 86 allows the female terminal 62 to deflect or deform slightly within the clearance 86, thereby absorbing possible misalignment between both circuit boards 2, 4. Also, it is to be noted that impedance matching is achieved by the mainbody sections 78, 38 of the female terminal 62 and the male terminal 22 encircling the bolt 6 at the center thereof.

The preferred embodiments of the coaxial connector according to the present invention have been described hereinbefore by reference to the accompanying drawings. The present invention is a coaxial connector for electrically interconnecting signal and ground circuits on a pair of circuit boards with predetermined spacing therebetween and matched impedance. It is to be understood that various modifications can be made in the shape of the housing and both male and female terminals may be a throughhole type rather than the surface mount type and the housings may be any desired shape other than circular or cylindrical. Also, it is to be understood that different housing heights may be used to adjust spacing between the two circuit boards or substrates.

The coaxial connector for connecting two substrates according to the present invention comprises an electrically conductive screw to mount a pair of substantially parallel substrates also defining the center contact and has the following advantages.

The two substrates or circuit boards can be interconnected with a short signal path, thereby minimizing signal delay of the high frequency signal to be transmitted through the coaxial connector. Additionally, the jumper cable is eliminated, thereby reducing the required component count, making the construction less expensive and simpler, and reducing the required space which is suitable for high density packaging. The mating operation is improved by simply bolt mating of the coaxial connector. The assembling is also very simple requiring only a single connection. The coaxial connector can be the spacer between the two circuit boards, thereby further reducing assembling steps of the two circuit boards and also reducing the cost due to reduced number of required spacers. Impedance can be controlled easily by choosing the diameter of the bolt for impedance matching.

We claim:

1. A coaxial connector for electrically connecting signal and ground conductors of circuit boards comprising a center contact member for connecting the signal conductors together and an outer contact means for connecting the ground conductors together, characterized in that said center contact member is extendable through the circuit boards and electrically engages the signal conductors on the outside surfaces of the circuit boards; and said outer contact means include matable members that telescopically engage each other including contact members electrically connectable with the ground conductors on the inner surfaces of the circuit boards.

2. A coaxial connector as claimed in claim 1, characterized in that said matable members are secured in insulating housing members with said contact members being disposed within slots in said housing members and including contact sections extending outwardly from said housing members and being disposed in the plane containing the bottom surface of said housing members.

3. A coaxial connector as claimed in claim 2, characterized in that said slots include latching surfaces engaging said contact members to maintain said contact members within said slots.

4. A coaxial connector as claimed in claim 2, characterized in that said matable members are cylindrical and one of said matable members has slots therein.

5. A coaxial connector as claimed in claim 4, characterized in that one of said housing members has a cylindrical section therein spaced from said matable member, and a coil spring is disposed between said cylindrical section and said matable member.

6. A coaxial connector as claimed in claim 1, characterized in that said center contact member comprises a bolt member having a head and a threaded section.

7. A coaxial connector for electrically connecting signal and ground conductors of circuit boards, comprising:

a first outer contact member having a first matable contact section and a first conductor contact section for electrical connection to the ground conductor on one of the circuit boards;

a second outer contact member having a second matable contact section telescopically matable with said first matable contact section for electrical connection therebetween and a second conductor contact section for electrical connection to the ground conductor of the other of the circuit boards;

and a center contact member extendable through the circuit boards and electrically connecting with the signal conductors on the circuit boards.

8. A coaxial connector as claimed in claim 7, wherein said first outer contact member is mounted in a first insulating housing with said first matable contact section disposed in said first insulating housing and said first conductor contact section includes at least three legs extending outwardly from said first insulating housing and having contact sections disposed in a plane containing the bottom surface of said first insulating housing.

9. A coaxial connector as claimed in claim 7, wherein said second outer contact member is mounted in a second insulating housing with said second matable contact section disposed in said second insulating housing and said second conductor contact section includes at least three legs extending outwardly from said second insulating housing and having contact sections disposed in a plane containing the bottom surface of said second insulating housing.

10. A coaxial connector as claimed in claim 7, wherein said center contact member is a bolt having a head member electrically engageable with the signal conductor on one of the circuit boards and a threaded section engageable with the signal conductor on the other of the circuit boards.

11. A coaxial connector as claimed in claim 8, wherein said first insulating housing has a circular section spaced from said first matable contact section, and a coil spring is disposed between the circular section and the first matable contact section.

* * * * *